United States Patent
Koller

(10) Patent No.: US 7,693,499 B2
(45) Date of Patent: Apr. 6, 2010

(54) TRANSMISSION PATH AND METHOD FOR SIGNAL PROCESSING IN A TRANSMISSION PATH

(75) Inventor: Rainer Koller, Linz (AT)

(73) Assignee: Infineon Technologies AG, Munich (DE)

( * ) Notice: Subject to any disclaimer, the term of this patent is extended or adjusted under 35 U.S.C. 154(b) by 653 days.

(21) Appl. No.: 11/581,507

(22) Filed: Oct. 16, 2006

(65) Prior Publication Data

US 2007/0105511 A1    May 10, 2007

(30) Foreign Application Priority Data

Oct. 19, 2005   (DE) .................. 10 2005 050 148

(51) Int. Cl.
*H01Q 11/12* (2006.01)
(52) U.S. Cl. ................. 455/127.2; 455/127.1; 455/125; 455/123; 455/115.2; 342/92; 342/174; 342/205
(58) Field of Classification Search .............. 455/127.2, 455/125, 123, 115.2; 364/571.01, 571.02
See application file for complete search history.

(56) References Cited

U.S. PATENT DOCUMENTS

| | | | | |
|---|---|---|---|---|
| 4,578,667 A | * | 3/1986 | Hollister | ...................... 341/122 |
| 5,293,325 A | * | 3/1994 | Roos | ............................ 702/89 |
| 6,321,073 B1 | * | 11/2001 | Luz et al. | ................. 455/239.1 |
| 6,418,304 B1 | | 7/2002 | Morrar | |
| 6,463,264 B1 | | 10/2002 | Obara | |
| 6,889,038 B2 | | 5/2005 | Khosrowbeygi | |

FOREIGN PATENT DOCUMENTS

DE    100 35 066 A1    3/2001

OTHER PUBLICATIONS

"A Single-chip 75-GHz/0.35-µm SiGe BiCMOS S-CDMA Homodyne Transceiver for UMTS Mobiles", Wolfgang Thomann, Volker Thomas, Richard Hagelauer and Robert Weigel, 2004 IEEE Radio Frequency Integrated Circuits Symposium, MO3B-5, pp. 69-72.
Kenington, Peter B. "Linearized Transmitters: An Enabling Technology for Software Defined Radio" IEEE Communications Magazine, Feb. 2002, pp. 156-162.
Springer, A. et al. "Adaptive Predistortion for Amplifier Linearization for UMTS Terminals" IEEE 7th Int. Symp. On Spread-Spectrum Tech & Appl., Prague, Czech Republic, Sep. 2-5, 2002, pp. 78-82.

* cited by examiner

*Primary Examiner*—Sanh D Phu
(74) *Attorney, Agent, or Firm*—Eschweiler & Associates, LLC

(57) ABSTRACT

In a transmission path, an input signal is amplified in a manner dependent on a digital control word present and is processed by an arrangement for signal processing to form an output signal. A digital setting word is read out from a memory device in a manner dependent on the digital control word, setting signals being derived from said setting word. The gain setting of the amplifier and the operating mode of the arrangement for signal processing are influenced by the setting signals.

19 Claims, 6 Drawing Sheets

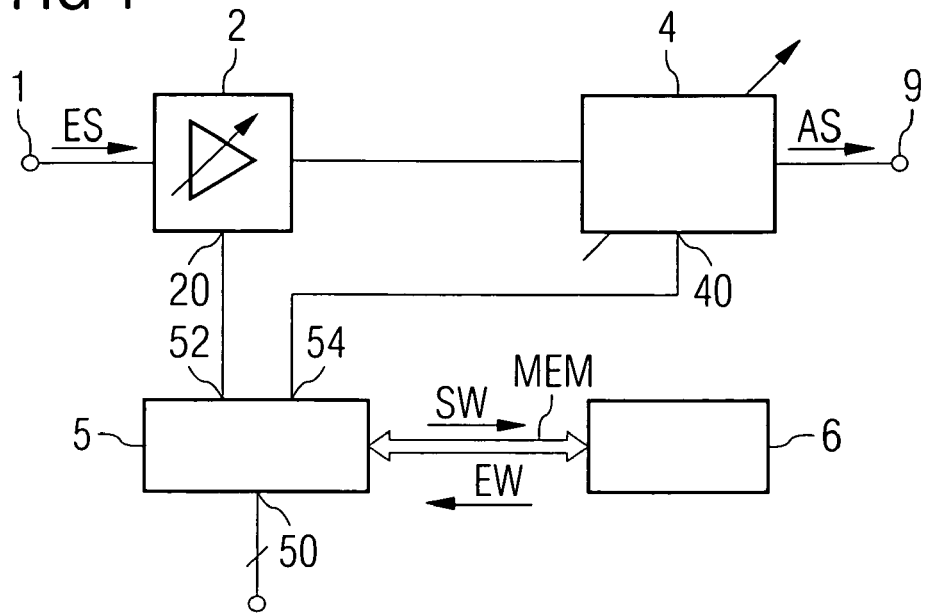
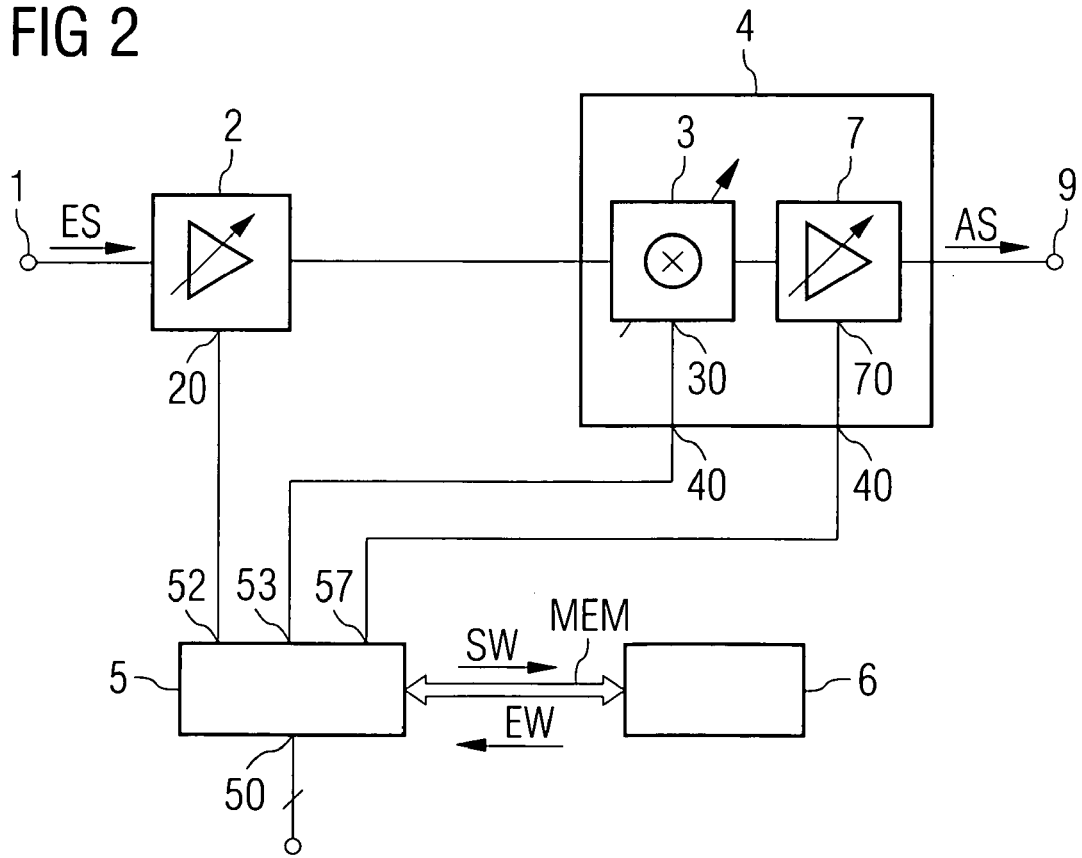

TRANSMISSION PATH AND METHOD FOR SIGNAL PROCESSING IN A TRANSMISSION PATH

FIELD OF THE INVENTION

The invention relates to a transmission path and to the use thereof. The invention furthermore relates to a method for signal processing in a transmission path.

BACKGROUND OF THE INVENTION

The requirements made of modern communication standards and of the signal quality of transmitting devices are rising with the growing need for high data rates and increasing mobility. Mobile radio standards that have become customary in the meantime, such as, for example, Universal Mobile Telecommunications System, UMTS, Wideband Code Division Multiple Access, WCDMA, Global System for Mobile Communications, GSM, Enhanced Data rates for GSM Evolution, EDGE, Wireless Local Area Network WLAN or medium-rate Bluetooth, use bandwidth-efficient modulation rates for transmitting high data rates both from a base station to a mobile device and from a mobile device to a base station. Examples of certain modulation rates are Quadrature Phase Shift Keying, QPSK, 8-Phase Shift Keying, 8-PSK or Quadrature Amplitude Modulation, QAM. With these types of modulation, for the purpose of transmitting the data, a so-called carrier signal is modulated both in terms of the phase and in terms of the amplitude.

In this case, a conventional transmitting device comprises a unit for baseband signal processing and a unit for radio frequency signal processing. In this case, the data to be transmitted are preprocessed in the baseband unit in such a way that they can be modulated on to the carrier signal and amplified in the radio frequency unit in order finally to be emitted via an antenna. In this case, in present-day mobile radio standards, the generation of the power required for the transmission signal takes place in the radio frequency range, in particular. Precisely in the case of UMTS it is necessary to provide a plurality of discrete amplification stages which together have to represent a highly linear UMTS amplification path. Said stages are embodied by a plurality of independent setting possibilities in the region of the radio frequency unit. In this case, a control block is fed an analog control signal which is intended to determine the respective amplification stage. In the control block, said control signal is converted into control voltages for the components for amplification and modulation.

FIG. 10 shows one embodiment of a conventional transmitting path, the arrangement comprises a first amplifying device 2 comprising a setting input 20, an I/Q mixer 3a comprising a setting input 30, and a further amplifying device 7 comprising a setting input 70. The arrangement furthermore has an analog control device 5a, comprising setting outputs 52a, 53a and 57a and an analog control input 50a. In this case, the setting inputs of the amplifiers and of the I/Q mixer are connected to the setting outputs of the control device. The setting signals present at the setting outputs are all derived from an analog control signal, which is fed in via the control input 50a, by the analog control device 5a. The influencing of the overall gain curve is achieved by means of diverse programming options in the control device. In this case, it is attempted to simultaneously ensure a minimal current consumption over the control range and also a sufficient linearity.

In the case of linear processing of a signal, the ratio of two values remains constant before and after the processing. In the case of nonlinear processing, by contrast, for example small input values are influenced to a greater extent than large input values, with the result that the value ratio changes. Nonlinear effects occur in amplifiers, for example, if the latter are overdriven, that is to say operated with excessively large signals. In this case, the current consumption arises as well. If amplifiers are underdriven, by contrast, that is to say operated with excessively small signals, their power loss is likewise disproportionately high.

Due to the analog processing of the control signal, the setting signals exhibit a certain dependence with respect to one another. This would not change, moreover, if the control signal were fed to a control device in digital form and converted into an analog control signal by means of a digital-to-analog converter. As a result of the dependence, the arrangement continues to be prohibited from generating arbitrary combinations of setting signals. Therefore, the common influence of the nonlinear characteristic curves of the amplifying elements can be taken into account only inadequately. This holds true particularly with application of a technology based on a Complementary Metal Oxide Semiconductor, CMOS, since the characteristic curves of the transistors used have a highly nonlinear profile. Consequently, the desired aim of a linear overall gain curve with simultaneous power optimal modulation cannot be achieved.

BRIEF SUMMARY OF THE INVENTION

One exemplary embodiment of a transmission path according to the principle proposed comprises a signal input, at least one first amplifying device having a setting input for variable gain setting, an arrangement for signal processing, and an arrangement for signal processing, which is coupled to the amplifying device and has a setting input for a signal for setting an operating mode from a set of at least two operating modes that can be set. Provision is furthermore made of a digital control device comprising an input for feeding in a digital control word and a memory device, in which digital setting words can be stored.

The digital control device is coupled to the memory device for the purpose of reading a digital setting word from the digital setting words stored in the memory device in a manner dependent on the digital control word fed in at the input of the control device. Furthermore, the digital control device is coupled to the setting input of the at least one amplifying device and the setting input of the arrangement for signal processing for the purpose of feeding in setting signals, which are derived from the digital setting word that has been read.

In one embodiment of a method according to the principle proposed, a digital control word is provided and a digital setting word is determined in a manner dependent on the digital control word. At least two setting signals are generated from the setting word determined, an input signal being amplified in a manner dependent on said setting signals.

Consequently, firstly the necessary number of setting signals is generated by virtue of a digital setting word being determined in a manner dependent on a digitally provided control word, from which digital setting word the setting signals can be derived. An input signal provided is amplified in a manner dependent on said setting signals. In this case, the setting signals may be present in digital form or else in analog form.

BRIEF DESCRIPTION OF THE DRAWINGS

The invention is explained in detail below on the basis of exemplary embodiments with reference to the drawings.

In the figures:

FIG. 1 shows a first exemplary embodiment of a transmission path according to the principle proposed, FIG. 2 shows a second exemplary embodiment of a transmission path according to the principle proposed.

DETAILED DESCRIPTION OF THE INVENTION

Figure 3:
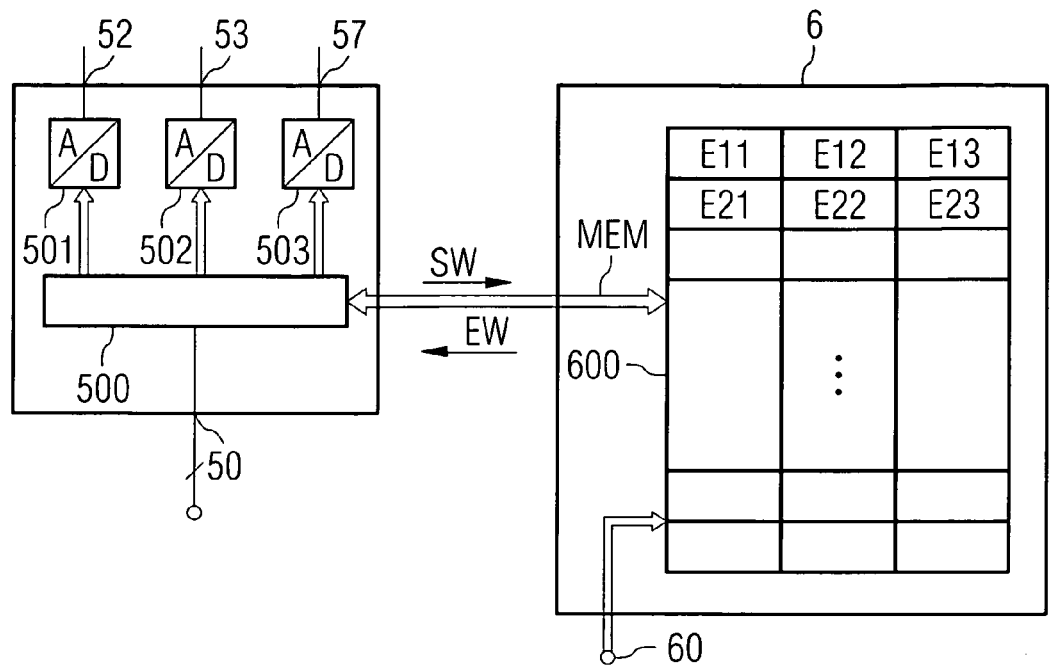
FIG. 3 shows an exemplary embodiment of a digital control device and a memory device according to the principle proposed.

Further aspects and embodiments of the present invention are summarized in the description that follows. In addition, reference is made to the accompanying figures, which form part of the description and in which illustrations show how the invention can be embodied in practice. The embodiments of the drawings represent a summary in order to enable a better understanding of one or more aspects of the present invention. This summary is not a complete overview of the invention not does it intend to restrict the features or key elements of the invention to a specific embodiment. Rather, the various elements, aspects and features which are disclosed in the exemplary embodiments can be combined by a person skilled in the art in various ways in order to achieve one or more advantages of the invention. It shall be understood that other embodiments could be used and that structural or logical alterations could be made without departing from the central concept of the present invention. The elements in the drawings are not necessarily scaled in a manner true to scale with respect to one another. Identical reference symbols designate mutually corresponding similar parts.

FIG. 1 shows a configuration of the transmission path proposed. The transmission path comprises a signal input 1 coupled to an amplifying device 2. An arrangement for signal processing 4 is coupled to the output of the amplifying device 2, the output of said arrangement for signal processing being connected to the signal output 9. The transmission path furthermore comprises a digital control device 5 and a memory device 6. The digital control device 5 has an input 50 for feeding in a digital control word. The digital control device 5 furthermore has a control output 52 connected to the setting input 20 of the amplifying device 2, and a control output 54 connected to the setting input 40 of the arrangement for signal processing 4. The digital control device 5 and the memory device 6 are coupled to one another via a data line MEM.

An input signal ES is fed to the transmission path via the signal input 1. A control word SW is fed to the digital control device 5 via the control input 50. The control word SW is forwarded to the memory device 6 via the data line MEM. In a manner dependent on said control word SW, a setting word EW is returned to the digital control device 5 by the memory device 6, setting signals being derived from said setting word. Via the control output 52 and the setting input 20, the amplifying device 2 is fed one of the setting signals for the purpose of setting a variable gain. Likewise, a further one of the setting signals, for the purpose of setting an operating mode, is fed from the control output 54 to the setting input 40 of the arrangement for signal processing 4. At the output of the transmission path, the input signal ES processed by the amplifying device 2 and the arrangement for signal processing 4 is tapped off as output signal AS via the signal output 9.

The variable gain setting of the amplifying device 2 serves to enable the latter to be operated with different gain factors or at different operating points. In the case of the arrangement for signal processing 4, too, the setting signal at the setting input 40 enables selection of each of the operating modes available for said arrangement. A respective combination of a possible gain setting and a possible operating mode is represented by a setting word stored in the memory device 6. Consequently, a multiplicity of different types of combinations of gain settings and operating modes are stored in the form of a nonlinear control curve in the memory device 6. Each of these combinations, represented by a setting word, can be read out by means of a control word. A very specific combination of settings is retrieved, then, as a result of a control word being fed in at the input 50 of the control device 5. The overall behavior of the transmission path is accordingly determined by the setting words stored in the memory device 6 in a manner dependent on the digital control word fed in at the input 50 of the control device 5. By means of the setting possibilities, the signals can always be processed in such a way that at the input of the respective next processing stage, the signals are constituted such that overdriving effects do not occur. A variable power setting in conjunction with a low current consumption is consequently obtained.

FIG. 2 shows a further exemplary embodiment. In the embodiment illustrated, the arrangement for signal processing 4 comprises a frequency converting device 3 comprising a setting input 30. The arrangement for signal processing 4 furthermore comprises a further amplifying device 7, which can be set in terms of its gain and which has a setting input 70. The signal input of the frequency converting device 3 is coupled, on the input side, to the signal input of the arrangement for signal processing 4 and, on the output side, to the signal input of the amplifying device 7, the signal output of which simultaneously represents the output of the arrangement for signal processing 4. The digital control device 5 comprises a control output 53 and a control output 57. In this case, the control output 53 is coupled to the setting input 30 of the frequency converting device 3 via the setting input 40 of the arrangement for signal processing 4. The control output 57 is likewise coupled to the setting input 70 of the amplifying device 7 via the setting input 40. The frequency converting device 3 serves for converting the amplified input signal ES to an output signal having an increased frequency. The conversion of the frequency is also referred to as mixing or modulation on to a carrier frequency. Since the number of setting signals has increased in comparison with FIG. 1, generally a higher number of possibilities for the combination of gain settings and operating modes results as well. This makes it possible, with suitable selection of the setting words stored in the memory device 6, to operate the transmission path in an operating state which ensures a smooth linear overall gain curve with at the same time a low current consumption.

FIG. 3 shows an exemplary embodiment of a digital control device 5 with a memory device 6.

The digital control device 5 comprises a control block 500 coupled to the input of the control device 50.

Three digital-to-analog converters 501, 502 and 503 coupled to the control block 500 furthermore are situated in the digital control device 5. The memory device 6 comprises a table 600, in which digital setting words or digital partial setting words E11, E12, E13, E21 etc. are stored. The memory device 6 furthermore has a programming interface 60 coupled to the table 600. In order to be able to provide the combinations of gain settings and operating modes necessary for the operation of the transmission path, it is expedient to store them in the table 600. This is realized by means of the programming interface 60, which makes it possible to store digital setting words in the memory device 6 and thus in the table 600.

Data exchange between the control block 500 and the table 600 is effected via the data line MEM. If a digital control word is fed to the digital control device 5 via the input 50, then said control word is forwarded as control word SW to the memory device 6 comprising the table 600 by the control block 500 via the data line MEM. In a manner dependent on the forwarded control word SW, in the table a table row, comprising for example the partial setting words E11, E12, E13, is selected and read out. The table row is then delivered back to the control block 500 as setting word EW via the data line MEM. In said control block, said setting word is decomposed into the partial setting words E11, E12 and E13. Said partial setting words are forwarded to the digital-to-analog converters 501, 502 and 503. The partial setting words E11, E12 and E13 converted into an analog signal in each case are then output via the control outputs 52, 53 and 57. Each partial setting word thus corresponds to a gain setting or a selected operating mode.

The table 600 can hold a specific number of setting words or partial setting words. By way of example, in the case of a control word having a width of 8 bits, 256 different setting words can be read out, each of which has a width of 18 bits, for example, 6 bits for each partial setting word. This corresponds to 64 different gain settings. As an alternative, the digital control word may also have a width of 10 bits, corresponding to 1024 setting words. The number and width of the partial setting words are not limited either, but rather are dependent on the embodiment chosen, in particular the number and accuracy of the setting signals required.

Figure 4:
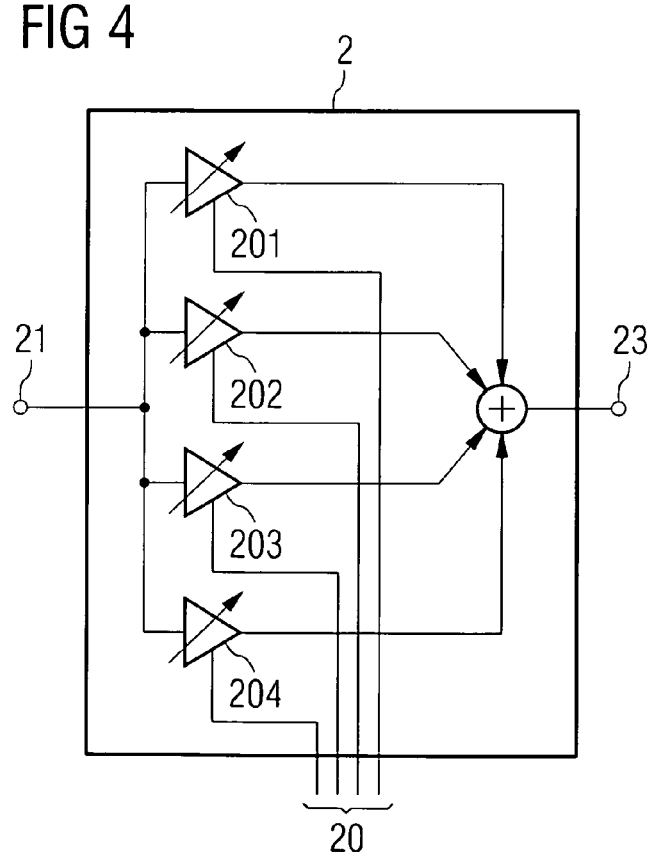
FIG. 4 shows an amplifying device comprising a plurality of parallel amplifiers according to the principle proposed.

FIG. 4 shows an exemplary embodiment of an amplifying device comprising a plurality of amplifiers arranged in parallel. In this case, in this embodiment the amplifying device 2 comprises four amplifiers 201, 202, 203 and 204 arranged in parallel, the setting input of which for variable gain setting is coupled to the setting input 20. In this case, the amplifiers 201, 202, 203 and 204 arranged in parallel are all connected to the signal input of the amplifying device 21 on the input side. On the output side, the amplified signal is combined and is tapped off via the signal output 23 of the amplifying device 2. At least one of the parallel amplifiers, for example the amplifier 201, has a gain that can be altered in continuous fashion by means of the setting signal. In the case of the rest of the amplifiers 202, 203 and 204, one from at least two operating modes is in each case selected by means of a setting signal. In this case, in one embodiment, one operating state may denote a switching off of the amplifier and the other operating state may denote a full modulation of the respective amplifier. Each of the four amplifiers 201, 202, 203 and 204 arranged in parallel is set by its own setting signal. In this case, the setting input 20 comprises four terminals for feeding in the independent setting signals. The exemplary embodiment of the amplifying device 2 that is shown here can also be used in comparable form for other amplifying devices occurring in the transmission path, for example for the amplifying device 7 from FIG. 2. The parallel amplifiers are embodied as voltage-controlled variable gain amplifiers, VGA. It is also possible, of course, to use amplifiers that can be set in value-discrete fashion.

Figure 5:
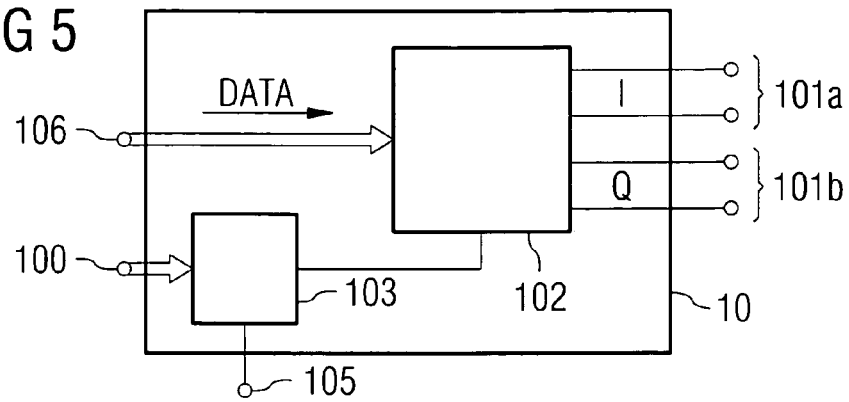
FIG. 5 shows a baseband unit.

FIG. 5 shows an exemplary embodiment of a baseband unit 10. It comprises an arrangement 102 for generating in-phase and quadrature components, I/Q components. Said arrangement is coupled to a control word generator 103 for generating digital control words. The arrangement 102 furthermore comprises an input 106 for feeding in the data words DATA to be transmitted and also a partial signal output 101a for tapping off the in-phase component and a partial signal output 101b for tapping off the quadrature component. The control word generator 103 has a control input 100 and also a control output 105. Data words DATA to be transmitted are fed to the baseband unit 10 via the input 106, from which data words the signal to be modulated is then generated in the form of an in-phase component and a quadrature component in the arrangement 102. The partial outputs 101a and 101b are used for tapping off the I/Q components and are coupled to the signal input 1 of the transmission path for further processing. Items of control information from which are derived, for example the parameters for the I/Q component generation in the arrangement 102 are fed to the control word generator 103 via the control input 100. However, digital control words for the digital control device 5 can also be generated therefrom, said digital control words being fed via the control output 105 to the control input 50 of the digital control device 5. Consequently, the transfer response of the transmission path is controlled by the baseband unit 10.

Figure 6:
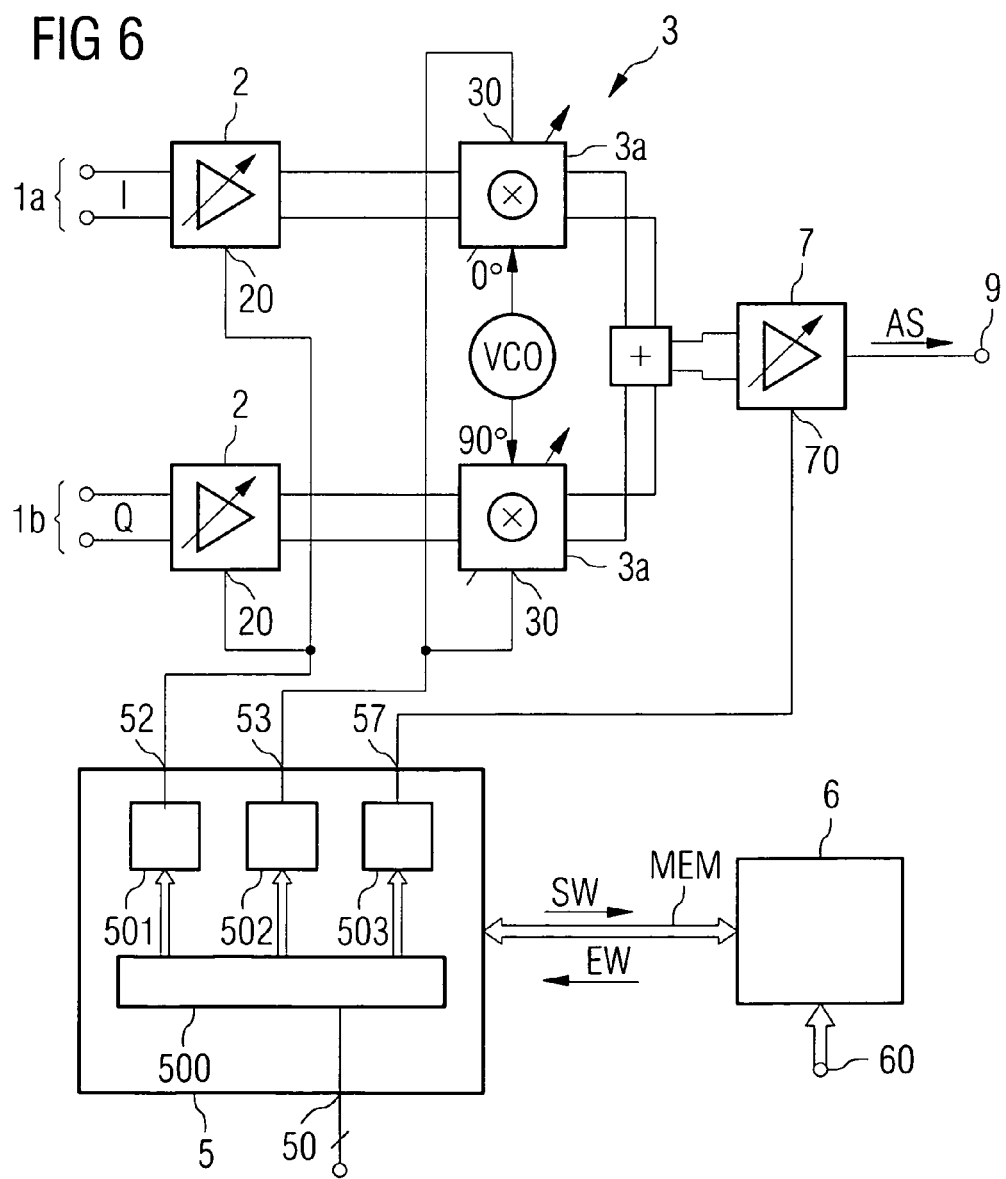
FIG. 6 shows a third exemplary embodiment of a transmission path according to the principle proposed.

FIG. 6 shows a further embodiment of the transmission path. The transmission path comprises a partial signal input 1a for feeding in an in-phase component and a partial signal input 1b for feeding in a quadrature component. The I/Q components are in each case fed to an amplifying device 2 comprising a setting input 20 for variable gain setting. The outputs of the amplifying device 2 are coupled to the frequency converting device 3. The latter comprises an I/Q mixer 3a, which is connected to the amplifying device 7 on the output side. Setting signals are also fed to the I/Q mixer 3a from the digital control device 5 via the setting input 30. In the transmission path, the I/Q components, which are generated by an arrangement in accordance with FIG. 5, for example, are then processed further. In this case, the in-phase and quadrature components are respectively amplified separately in the amplifying device 2 and then fed to the I/Q mixer 3a. The radio frequency components required for the modulation in the I/Q mixer are provided by a voltage-controlled oscillator, to be precise with a phase angle of 0° for the in-phase component and a phase angle of 90° for the quadrature component. The now modulated I/Q components are combined and, after amplification by the amplifying device 7, are tapped off as output signal AS via the signal output 9. The setting of the operating modes and of the gain settings is effected as before by means of the control device 5. In this case, too, the setting possibilities by means of the nonlinear control curve make it possible for the signals always to be processed in such a way that the signals at the input of the respective next stage are constituted such that overdriving effects do not occur.

Figure 7:
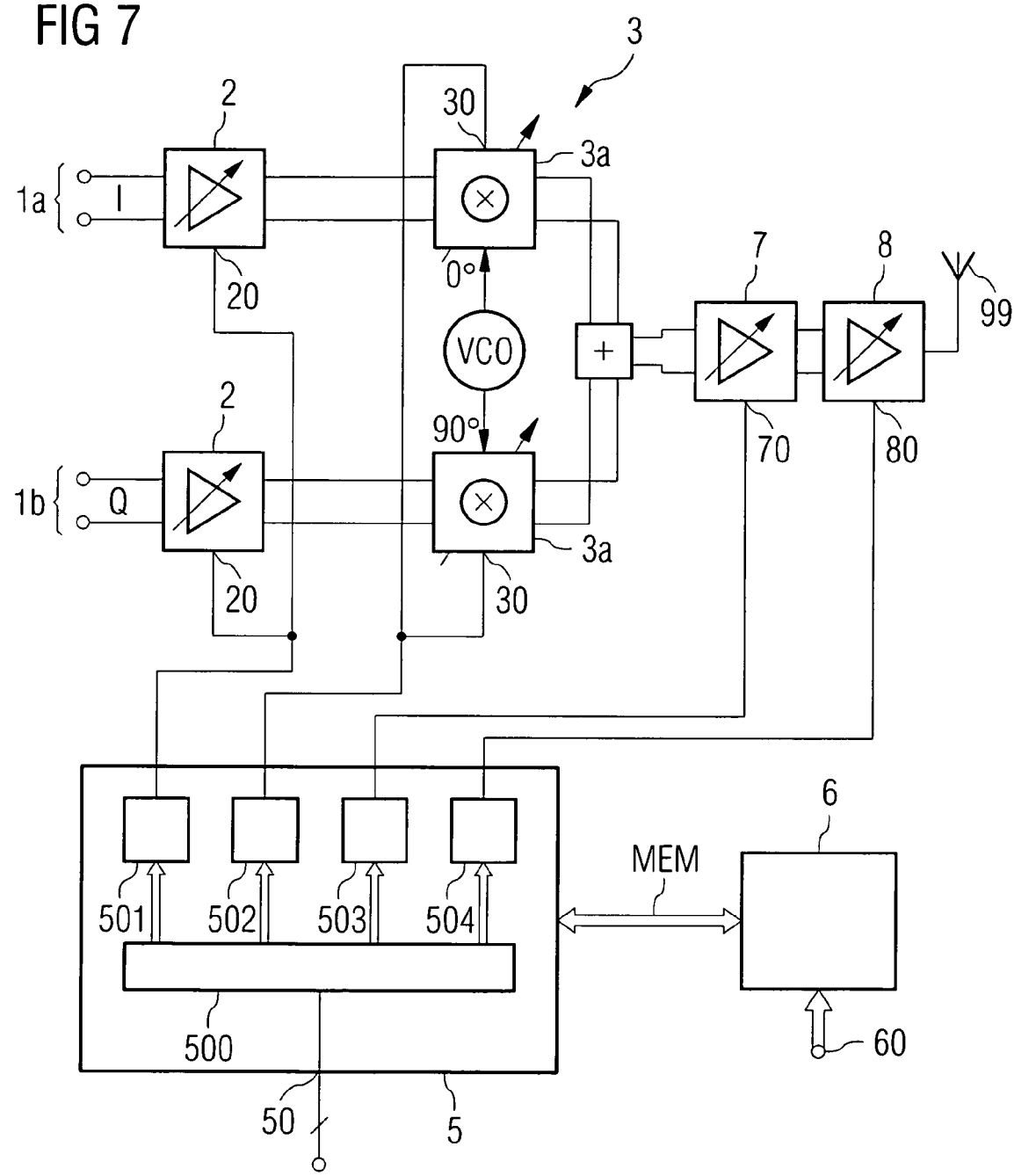
FIG. 7 shows a fourth exemplary embodiment of a transmission path according to the principle proposed.

FIG. 7 shows a further embodiment of the transmission path. A further amplifying device 8 for power amplification is connected downstream of the amplifying device 7. The output signal of the power amplifier 8 is applied directly to an antenna 99. The amplifying device 8 has a setting input 80 for a variable gain setting, which is preferably coupled to a digital-to-analog converter 504 in the digital control device 5. Consequently, the complete transfer response of the transmission path from feeding in the I/Q components to be modulated through to the emission of the modulated signal is controlled by feeding in a digital control word at the input 50 of the digital control device 5.

Figure 8:
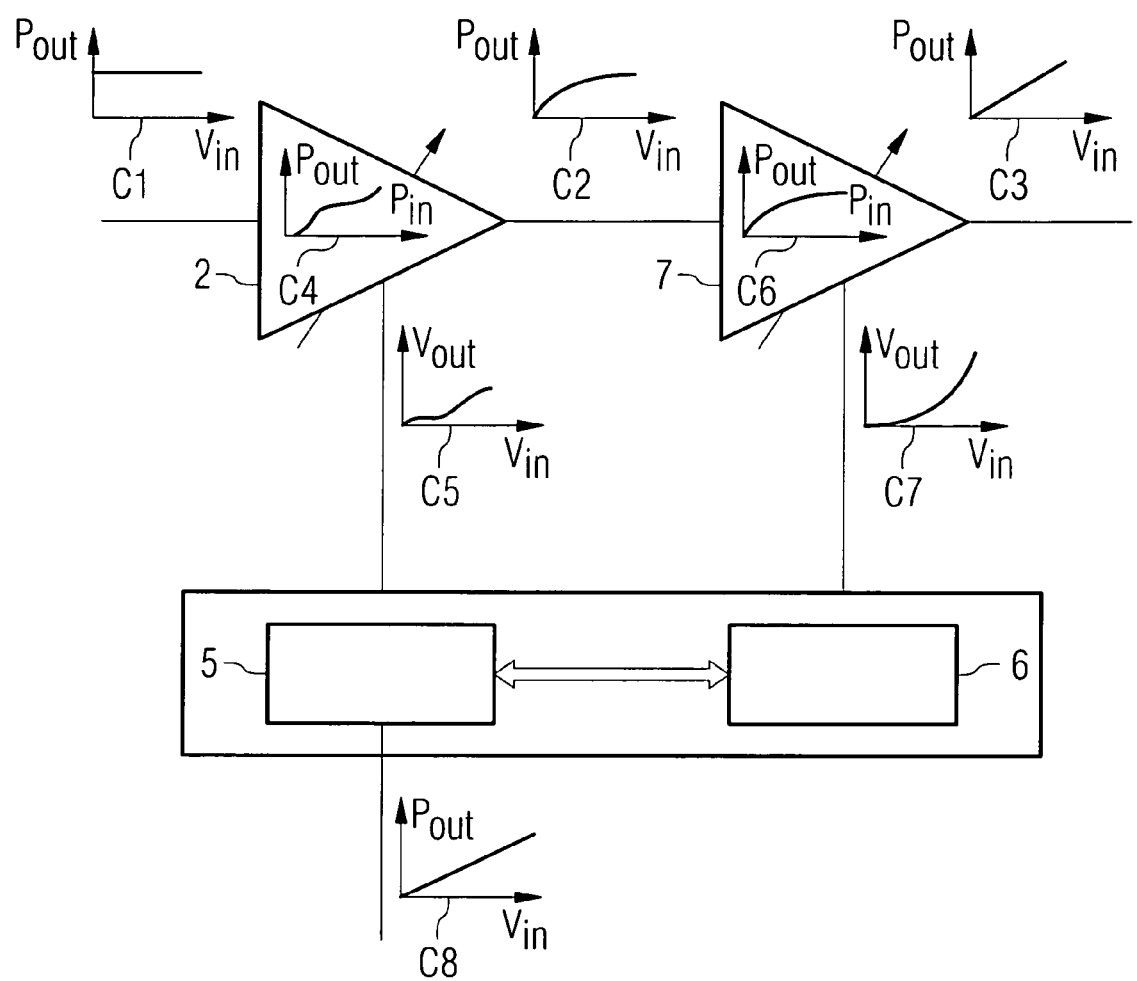
FIG. 8 shows characteristic curve diagrams within the transmission path proposed.

FIG. 8 shows the proposed principle of the characteristic curve control in a transmission path on the basis of an example. A signal in accordance with characteristic curve C1 is fed to an amplifier 2. The latter has a transfer response in accordance with characteristic curve C4. It is controlled in accordance with characteristic curve C5 via a setting input. Its output signal in accordance with characteristic curve C2 is fed to a further amplifier 7, which has a gain characteristic curve C6 and is controlled by characteristic curve C7. The output signal of the amplifier 7 behaves in accordance with characteristic curve C3. The arrangement furthermore has a known digital control device 5 and a memory device 6. The control device 5 is fed digital control words in accordance with characteristic curve C8, which are intended to effect a linear response of the amplifier chain in the transmission path. That is to say that given a doubled input voltage, for example a doubled output power is produced.

The control characteristic curves C5 and C7 for the amplifiers 2 and 7 are produced by means of the setting words stored in the memory device 6 and the setting signals derived therefrom. An input signal has, for example, the same power for each voltage in accordance with characteristic curve C1. The amplifier 2 has a nonlinear transfer response in accordance with characteristic curve C4, but said transfer response is compensated for by means of the setting signals in accordance with characteristic curve C5 in such a way that the amplified signal has a ratio of power to voltage in accordance with characteristic curve C2. In this case, characteristic curve C2 may represent nonlinear response. The signal is then processed by the amplifier 7 in a similar manner, the nonlinear transfer response of the amplifier 7 in accordance with characteristic curve C6 being cancelled by the control of the gain setting in accordance with characteristic curve C7. A desired linearly amplified signal having a ratio of power-to-voltage in accordance with characteristic curve C3 is then produced as the output signal. The desired linear transfer response of the overall path is ensured by skilful combinations of gain settings which are stored as setting words in the memory device 6 and represent the nonlinear control curve.

Figure 9:
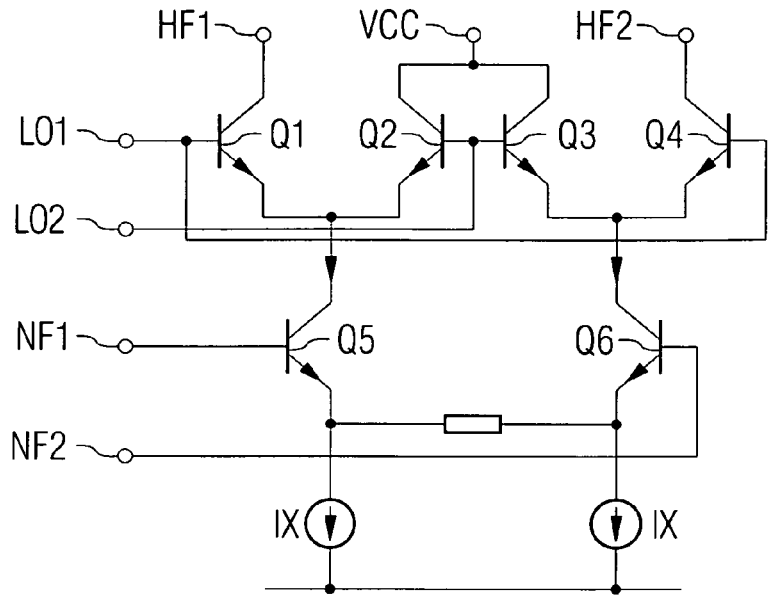
FIG. 9 shows an exemplary embodiment of a frequency converting device according to the principle proposed.
Figure 10:
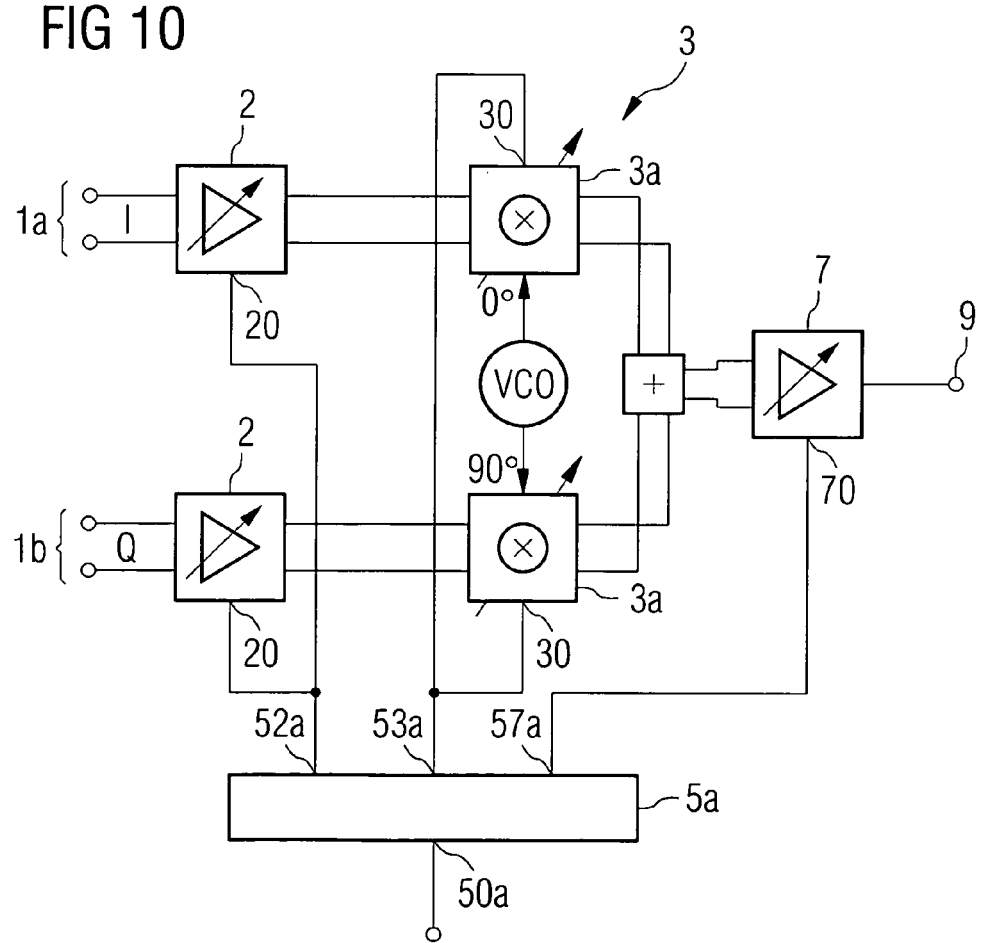
FIG. 10 shows a known transmission path with analog control.

FIG. 9 shows an exemplary embodiment of a frequency converting device. In a double push-pull mixer, the local oscillator signal is fed in at the inputs LO1 and LO2 and the useful signal to be modulated is fed in at the inputs NF1 and NF2. A supply voltage is provided at the terminal VCC. The modulated radio frequency signal can be tapped off at the terminals HF1 and HF2, for example. The amplitude of the output signal and thus the gain of the mixer can be multiply influenced. By way of example, the current source IX can be influenced by a control signal. A gain setting of the mixer is also possible by means of a corresponding bias voltage of the transistors Q5 and Q6. The gain of the mixer can likewise be set by means of so-called shunting of the transistors Q2 and Q3, that is to say bridging of the corresponding current paths with an electrical component for conducting away in a targeted manner a portion of the current flowing through. By way of example, further transistors may be used as bridging components, the control terminals of said further transistors being coupled to the setting input 30 of the frequency converting device. The gain can furthermore be varied by influencing the amplitude of the local oscillator signal. In general, two modulators of identical type, in each case for the in-phase component and the quadrature component, are used in an I/Q mixer.

The various configurations can be combined without this contravening the essence of the invention. In addition, both voltage-controlled variable gain amplifiers, VGA and programmable gain amplifiers, PGA can be used as amplifiers. A combination of the two types of amplifier is also possible. Moreover, the transmission path can be embodied by itself or jointly with a baseband unit in a semiconductor body.

In accordance with the principle proposed, a digital control word is fed to a digital control device. A setting word is read out from a memory device, in which a multiplicity of digital setting words can be stored in a manner dependent on said control word. A plurality of setting signals are derived from said setting word by the digital control device. Said setting signals are respectively fed to the setting input of the amplifying device and to the setting input of the arrangement for signal processing. The gain setting of the amplifying device is thereby determined and an operating mode for the arrangement for signal processing is thereby selected.

In this case, one advantage of the principle proposed resides in the fact that a set of setting signals corresponds to each of the digital setting words stored in the memory device. It is thereby possible to combine an arbitrary gain setting and an arbitrary setting of an operating mode in each setting word. What is more, it is possible, with the multiplicity of setting words, to derive a multiplicity of sets of setting signals which represent a linear overall gain characteristic curve in a manner dependent on the digital control words. A nonlinear control curve which ensures linear operation of the controlled elements can thus be represented by the totality of the digital setting words. Corresponding operating states of the amplifying device and of the arrangement for signal processing are furthermore distinguished, as a consequence of the combination possibilities, by a low current consumption.

In one embodiment, the arrangement for signal processing comprises a frequency converting device for generating the radio frequency signal. The frequency converting device furthermore comprises a setting input coupled to the setting input of the arrangement for signal processing. It is thereby possible to select an operating mode for the frequency converting device by means of a setting signal. An operating mode with a low current consumption is advantageously set here. The frequency converting device may be embodied as a modulator with a gain that can be set in continuous fashion. In this case, the setting is likewise effected by means of a setting signal at the setting input.

In a further embodiment, the arrangement for signal processing comprises at least one second amplifying device which can be set in terms of its gain. The setting input of this amplifying device is coupled to the setting input of the arrangement for signal processing. By applying a setting signal to the second amplifying device, any arbitrary gain setting can again be fed in. The setting signal is derived by the digital control device in a manner dependent on a setting word adapted to the requirements for the desired overall operating state.

In another configuration, the memory device comprises a programming interface, by means of which the digital setting words can be stored. It is thereby possible for the digital setting words from which the digital setting signals are derived to be stored in the memory device. This can be carried out both before and during operation. What is advantageous in this case is that the influences of component parameters of the amplifying devices and of the devices within the arrangement for signal processing do not have to be taken into account from the outset. Rather, it is possible to determine a multiplicity of setting words adapted to said influences and then to store said setting words in the memory device.

In a further configuration, at least one of the setting inputs is coupled to the digital control device via a digital-to-analog converter. This serves for converting the digital setting word into analog setting signals. If the devices comprising a setting input expect an analog setting signal at the latter, such as, for example a voltage-controlled variable gain amplifier, VGA, then the digital setting word read from the memory device is converted by means of the digital-to-analog converter. In this case the digital-to-analog converter may be arranged both within and outside the digital control device.

In an alternative embodiment, at least one of the amplifying devices comprises a plurality of amplifiers arranged in parallel, at least one of which amplifiers can be set in continuous fashion in terms of the gain by means of the setting signal and the rest of which amplifiers have at least two gain settings that can be controlled by means of the setting signal. In this case, the signal inputs of the amplifiers arranged in parallel are coupled to one another. The overall output signal of the amplifying device is derived from the combination of the output signals of the amplifiers arranged in parallel. At least one of the amplifiers can be varied in continuous fashion in terms of its gain. The at least two gain settings of the rest of the amplifiers can be achieved by switching on and switching off of the respective amplifier. As a result, the parallel amplifiers can in each case be operated with gain settings that are favorable for them. A dedicated setting signal can be provided for each of the parallel amplifiers.

In another configurational form, in each case two of the amplifiers arranged in parallel may again have a factor that is different by the factor 2 in terms of their maximum gain setting. As a result, the amplifiers arranged in parallel can be weighted in binary fashion for the overall gain of the amplifying device. In this case, binary weighting is understood to mean that a desired overall gain is obtained by the combination of a selection of single, double, quadruple, etc. basic gain depending on the number of parallel amplifiers used. By way of example, voltage-controlled variable gain amplifiers, VGA, can also be used for the amplifiers arranged in parallel.

In one development of the principle presented, the setting word to be read from the memory device comprises at least two partial setting words from which a respective one of the setting signals is derived by the digital control device. Consequently, a setting word composed of a plurality of partial setting words can be stored in the memory device for each control word present. A respective partial setting word is preferably available for each setting signal required.

In another development, the signal input of the transmission path comprises a first partial input for feeding in an in-phase component and a second partial input for feeding in a quadrature component. The arrangement for signal processing furthermore has an I/Q mixer. In this case, the two components may respectively be fed to a separate, independent amplifying device. In this case, the amplifying devices for the in-phase component and the quadrature component can be set both by means of an individual setting signal and by means of two independent setting signals. In the I/Q mixer the two components are modulated to form a radio frequency signal.

In a continuation of the principle proposed, a baseband unit comprising two partial outputs is connected upstream of the transmission path, said baseband unit being designed for generating an in-phase component to be modulated and a quadrature component to be modulated from data words to be transmitted. In this case, the first partial output is provided for outputting the in-phase component and the second partial output is provided for outputting the quadrature component.

In one development, the baseband unit has a control word generator for generating digital control words, comprising a control input and at least one control output. The control output is preferably coupled to the input of the digital control device of the transmission path. As a result, it is possible to generate in the baseband unit a control word by means of which a digital setting word stored in the memory device can be read out.

In one embodiment, the transmission path proposed may also be formed in a semiconductor body. In this case, the signal input and the signal output of the transmission path are led out through contact locations on the surface of the semiconductor body.

The transmission path can advantageously be used, in one of the embodiments described in a transmitting/receiving unit in a mobile radio device.

In one embodiment of the method, the amplifying comprises providing at least one amplifying device and at least one arrangement for signal processing having at least two operating modes. In this case, a first one of the at least two setting signals serves for setting the gain of the at least one amplifying device and a second one of the at least two setting signals serves for setting one of the at least two operating modes of the at least one arrangement for signal processing. The input signal is furthermore fed to the amplifying device. It thus becomes possible to determine a specific dependent digital setting word as a result of the provision of a digital control word. A set of at least two setting signals corresponds to said digital setting word. The amplifying device is thus fed a specific gain setting for a multiplicity of gain settings. At the same time, a specific operating mode can be selected from the number of available operating modes of the arrangement for signal processing. A multiplicity of combinations of gain settings and different operating modes can thus be set depending on the number of available setting words.

In a further embodiment, when generating the setting signals, the digital setting word is converted into at least two different analog setting signals. In this case a single digital-to-analog converter may be provided for all the setting signals, or, as an alternative, a dedicated digital-to-analog converter may be provided for each of the setting signals. A combination of analog and digital setting signals, derived from the digital setting word is likewise possible.

In another embodiment of the method, the generating of the setting signals comprises decomposing the digital setting word into at least two partial setting words and generating setting signals from the at least two decomposed partial setting words. Consequently, the digital setting words in each case comprise a plurality of digital partial setting words used for generating the setting signals.

As an alternative, when determining a digital setting word, a table is provided, in which a multiplicity of digital setting words are stored. From the multiplicity of setting words stored in said table, one digital setting word is read out in a manner dependent on the digital control word. In this case, in the table, each control word is assigned a digital setting word, which may in turn comprise a plurality of digital partial setting words.

Although only a few specific configurations of the invention have been illustrated and described, a person skilled in the art can readily recognize that any arrangement suitable for realizing the principle proposed can be replaced by the configurations specified. It becomes clear to the person skilled in the art that the above description primarily serves to elucidate the inventive principle and is therefore not restrictive either. In particular, it is not restricted to the embodiments of the invention presented.

The application covers all modifications and variations of the invention. Combinations of the above configuration and further embodiments are readily apparent to the person skilled in the art with the aid of the above description. The scope of the invention also extends to applications which use the disclosed arrangements and methods. Taking account of the claims, the scope of the invention is intended to be determined together with the equivalent scope resulting from the claims.

It is emphasized that the abstract is enclosed in order to comply with 37 C.F.R. Section 1.72(b), which demands an abstract that enables a reader to rapidly acquire the essential aspects of the technical teaching disclosed. It is submitted in the knowledge that the abstract is not used for the interpretation and restriction of the scope of protection or the meaning of the claims.

The invention claimed is:

1. A transmission path in a communication device, comprising
    a signal input;
    a first amplifying device comprising a setting input to receive a variable gain setting;
    a signal processing arrangement coupled to the first amplifying device, and comprising a setting input for receiving a signal for setting an operating mode thereof from a set of at least two operating modes;
    a signal output for tapping off an output signal, the signal output coupled to an output of the signal processing arrangement;
    a digital control device comprising an input for receiving a digital control word;
    a memory device comprising digital setting words stored therein;
    wherein the digital control device is coupled to the memory device and configured to read a digital setting word from the digital setting words stored in the memory device based on the digital control word fed in at the input of the control device; and
    wherein the digital control device is coupled to the setting input of the first amplifying device and the setting input of the arrangement for signal processing, and configured to provide setting signals thereto, the setting signals derived from the digital setting word.

2. The transmission path of claim 1, wherein the signal processing arrangement comprises a frequency converting device for generating a radio frequency signal which is coupled to the setting input thereof.

3. The transmission path of claim 2, wherein the frequency converting device comprises a modulator with a gain that is set in a substantially continuous fashion comprising a setting input coupled to the setting input of the signal processing arrangement.

4. The transmission path of claim 1, wherein the signal processing arrangement comprises at least one second amplifying device comprising an adjustable gain, wherein the at least one second amplifying device is coupled to the setting input thereof.

5. The transmission path of claim 1, wherein the memory device comprises a programming interface via which the digital setting words are stored in the memory device.

6. The transmission path of claim 1, wherein the digital control device is coupled to at least one of the setting inputs via a digital-to-analog converter for converting the digital setting word into analog setting signals.

7. The transmission path of claim 1, wherein the first amplifying device comprises a plurality of amplifiers arranged in parallel, and wherein at least one of which amplifiers is set in substantially continuous fashion in terms of the gain by the setting signal and the rest of the amplifiers have at least two gain settings that are controlled by the setting signal.

8. The transmission path of claim 7, wherein two of the plurality of amplifiers arranged in parallel have a gain factor that is different by the factor two in terms of their maximum gain setting.

9. The transmission path of claim 1, wherein the setting word comprises at least two partial setting words and the control device is configured to derive the setting signals from the partial setting words.

10. The transmission path of claim 1, wherein the signal input of the transmission path comprises a first partial input for receiving an in phase component and a second partial input for receiving a quadrature component, and wherein the arrangement for signal processing comprises an I/Q mixer.

11. The transmission path of claim 10, further comprising a baseband unit comprising two partial outputs connected upstream of the transmission path, said baseband unit configured to generate an in-phase component to be modulated and a quadrature component to be modulated from data words to be transmitted, and output the in-phase component to the first partial output and the quadrature component to the second partial output.

12. The transmission path of claim 11, wherein the baseband unit comprises a control word generator for generating digital control words, comprising a control input and a control output coupled to the input of the digital control device of the transmission path.

13. The transmission path of claim 1, wherein the transmission path is formed in a semiconductor body and the signal input and the signal output of the transmission path are led out through contact locations on the surface of the semiconductor body.

14. A method for signal processing in a transmission path in a mobile communication device, comprising:
    determining a digital setting word based on a digital control word;
    generating at least two setting signals from the determined digital setting word; and
    amplifying an input signal in a manner dependent on the at least two setting signals;
    wherein generating the setting signals comprises:
    decomposing the digital setting word into at least two partial setting words; and
    generating the setting signals from the at least two decomposed partial setting words.

15. A method for signal processing in a transmission oath in a mobile communication device, comprising:
    determining a digital setting word based on a digital control word;
    generating at least two setting signals from the determined digital setting word; and
    amplifying an input signal in a manner dependent on the at least two setting signals, wherein amplifying the input signal comprises:
    setting a gain of at least one amplifying device by means of a first one of the at least two setting signals;
    setting one of at least two operating modes of a signal processing arrangement by means of a second one of the at least two setting signals; and
    inputting the input signal to the at least one amplifying device.

16. The method of claim 14, wherein generating the setting signals comprises converting the digital setting word into at least two analog setting signals.

17. The method of claim 14, wherein determining the digital setting word comprises:

providing a table comprising a plurality of digital setting words stored therein; and reading a digital setting word from the plurality of setting words stored in the table based on the digital control word.

18. A transmission path in a mobile communications device, comprising:

a variable gain amplifier configured to receive an input signal at a signal input and generate an amplified signal at an output thereof, and further comprising a setting input configured to receive a setting signal for setting a gain thereof;

a signal processing device configured to process the amplified signal to form a processed signal at an output thereof based on a mode of operation, and further comprising a setting input configured to receive a setting signal for setting an operating mode thereof;

a memory comprising a plurality of digital setting words therein; and a digital control device configured to receive a digital control word and retrieve one of the plurality of digital setting words from the memory in response thereto, and further configured to transmit setting signals to the variable gain amplifier and signal processing device, respectively, based on the retrieved digital setting word.

19. The transmission path of claim 18, wherein each digital setting word comprises a plurality of partial setting words respectively associated with components receiving setting signals from the digital control device.

* * * * *

UNITED STATES PATENT AND TRADEMARK OFFICE
CERTIFICATE OF CORRECTION

PATENT NO. : 7,693,499 B2  Page 1 of 1
APPLICATION NO. : 11/581507
DATED : April 6, 2010
INVENTOR(S) : Rainer Koller It is certified that error appears in the above-identified patent and that said Letters Patent is hereby corrected as shown below:

Column 12, Claim 15, line 47; Please replace "oath" with --path--

Signed and Sealed this

Eighteenth Day of May, 2010

David J. Kappos
*Director of the United States Patent and Trademark Office*